United States Patent

Burr

[15] 3,674,914

[45] July 4, 1972

[54] WIRE SCRIBED CIRCUIT BOARDS AND METHOD OF MANUFACTURE

[72] Inventor: Robert Page Burr, Huntington, N.Y.

[73] Assignee: Photocircuits Corporation, Glen Cove, N.Y.

[22] Filed: March 5, 1970

[21] Appl. No.: 16,742

Related U.S. Application Data

[63] Continuation-in-part of Ser. No. 704,383, Feb. 9, 1968, abandoned, which is a continuation-in-part of Ser. No. 628,701, April 5, 1967, abandoned.

[52] U.S. Cl. .................................174/68.5, 29/625, 29/626, 156/166, 156/436, 317/101 CM, 317/101 CC

[51] Int. Cl. ..........................................................H05k 3/20

[58] Field of Search ...............174/68.5; 317/101 B, 101 CM; 29/625, 626; 250/211 J, 227; 350/96 B; 156/436, 439, 166, 176; 117/212

[56] References Cited

UNITED STATES PATENTS

| | | | |
|---|---|---|---|
| 3,234,629 | 2/1966 | Wheeler | 174/68.5 UX |
| 3,239,396 | 3/1966 | Bohannon, Jr. | 156/436 X |
| 3,247,314 | 4/1966 | Mittendorf | 174/68.5 |
| 3,470,612 | 10/1969 | Helms | 174/68.5 X |
| 2,066,876 | 1/1937 | Carpenter et al. | 174/68.5 UX |
| 2,958,018 | 10/1960 | Kocmich | 174/117 F |
| 2,958,926 | 11/1960 | Morison | 317/101 CC X |
| 3,157,733 | 11/1964 | De Masi | 29/626 UX |
| 3,191,100 | 6/1965 | Sorvillo | 317/101 CM |
| 3,353,263 | 11/1967 | Helms | 29/626 |
| 3,379,832 | 4/1968 | Judin | 250/227 X |
| 3,391,969 | 7/1968 | Ogle | 350/96 B |

FOREIGN PATENTS OR APPLICATIONS

| | | | |
|---|---|---|---|
| 565,540 | 7/1957 | Italy | 174/68.5 |

*Primary Examiner*—Darrell L. Clay
*Attorney*—Morgan, Finnegan, Durham & Pine

[57] ABSTRACT

The present invention represents a new approach to solving modern electronic packaging problems which combines in one system the best features of discrete wiring techniques and printed circuits. According to this invention, there are provided new and useful procedures whereby a prefabricated organized wire interconnecting device, hereinafter referred to as a wire scribed circuit board, is produced by writing or plotting a predetermined circuit interconnection onto the surface of an insulating base using as the writing medium or "ink" a continuous wire filament. The wire is fed onto the surface of the base continuously from one side thereof, simultaneously affixed to the base to form the interconnecting pattern, and cut at the finish of each line, to thereby form a written wire image of a predetermined interconnecting pattern on the base. Preferred embodiments of the wire scribed boards include a wire image of a predetermined interconnecting pattern in which wire conductors exhibit inflection points produced solely as a result of the writing technique and/or crossovers in essentially the same plane as the wire, as well as connection terminals to which the written wire lines and/or electrical components may be attached. The boards resemble a printed circuit board in appearance and cubic packing potential, although no art work or graphic processes of any kind are employed in their production. Unlike printed circuit boards, repairs as by conductor additions or deletions or modifications may be readily made.

13 Claims, 28 Drawing Figures

WIRE SCRIBED CIRCUIT BOARDS AND METHOD OF MANUFACTURE

This application is a continuation-in-part of application Ser. No. 704,383, filed Feb. 9, 1968 now abandoned, which in turn is a continuation-in-part of application Ser. No. 628,701, filed Apr. 5, 1967 now abandoned, and relates to wire scribed circuit boards produced by a variety of apparati, including the type described in copending U.S. Pat. application Ser. No. 865,008, filed by Raymond J. Keogh and Frank J. Wilczek. These co-pending applications which have a common assignee herewith are incorporated herein by reference.

It is standard practice in the electronic packaging art to produce electrical wiring assemblies on an automatic or semi-automatic basis using printed circuit techniques, including print and etch and additive printed circuit technology. Manufacture of printed circuit boards is characterized by the fact that uninsulated electrical conductors are produced in situ upon an insulating support by a process based on the imprinting of a representation or pattern of conducting metal onto an insulating base.

In printed circuit board manufacture, much time, effort and expense are involved in the layout of circuit pattern drawings and/or the photographic work involved in producing an imprint of the pattern upon the insulating base.

Besides cost, such technology has inherent disadvantages. For example, the conductor lines produced in situ by a printing process tend to be relatively thin and subject to short circuits and breakage. Additionally, printed conductors lines tend to be inexorably fixed to the base, so that changes, alterations or repairs thereto are so difficult and expensive as to be economically unfeasible.

In spite of the foregoing, where there is a demand for sufficiently large numbers of identical, relatively simple circuits, such as, for example, in the production of radios, television sets, communication equipment and the like, resort to printed circuit technology is economically attractive because the advantages of mass production offset the high initial layout expenses and other enumerated disadvantages.

In recent years, many of the components used with prefabricated printed circuit boards have been miniaturized and combined, thereby rendering them more compact and substantially increasing the number of terminals required in a given circuit board area. Thus, the terminal and conductor density requirements of organized wire interconnecting devices, such as printed circuit devices of the type under discussion, have been substantially increased in recent years. Because the conductors on conventional printed circuit boards are not insulated, the proximity of the terminals to each other and the density that can be provided is limited. Hence, in order to provide the necessary conductors and terminals to meet the modern needs of the industry, the printed circuit art has resorted to stacking as by lamination a plurality of printed circuit boards, one over the other, thereby producing multi-layer boards. In this way, the number of conductors and terminals can be increased but the costs of layouts and fabrication are increased many fold. Furthermore, changes, alterations or repairs to such multi-layer boards are so difficult and expensive as to render them impractical.

Thus, while printed circuits were originally developed as a means for providing circuit boards with relatively low density interconnections in large quantities and at low cost, the present pressures in electronics packaging are toward boards having high interconnection density in small quantities at low cost and with short turn-around time. The tooling and manufacturing steps of conventional printed circuit techniques are incompatible with such needs. As a result, an increasing proportion of electronic packages is being interconnected by "-Wire-Wrap" and similar discrete wiring technologies. Although such alternative approaches tend to satisfy the tooling simplification and fast turn-around objectives, they generally lead to increased hardware cost and weight per unit component with lower packaging density per cube in comparison to printed circuits.

It is an object of this invention to overcome these and other disadvantages associated with organized interconnection devices of the type described.

According to this invention, there are provided wire scribed circuit boards which combine the adaptability and versatility of discrete wire technology with the compactness and convenience of printed circuit boards.

There are also provided unique procedures for producing such boards which include the writing of conductor paths on an insulating base by feeding a continuous strand of preformed wire onto the surface of the base continuously from one side thereof, simultaneously affixing the wire to the base and cutting the wire at the end of each written line to thereby produce a wire image of a predetermined interconnecting pattern. The wire scribed circuit boards as taught herein are provided with conductive terminals which serve to connect written wire lines to each other and other terminals which serve to connect the wire pattern to external circuit components.

No artwork or graphic processes are required to generate the interconnecting pattern on the board of the instant invention. Nevertheless, the interconnecting pattern is accurately repeatable, thereby permitting production of as many successive boards which are electrically and mechanically identical with the first as may be desired.

The interconnecting pattern may include preformed, integral conductors on very tight centers with essentially no limitation on crossovers in the same plane. In a preferred embodiment, it is characterized by at least one conductor which extends along an inflection path between terminals.

The wire scribed circuit board resembles a printed circuit board in appearance and cubic packing potential. As many successive boards as may be desired, each identical with the first, may be produced. Repairs, modification, addition or deletion of conductor lines may be made manually and readily to the conductor patterns. If desired, wire patterns may be written upon the surface of a board already containing prefabricated features such as ground connections, voltage connections, fingers and the like, as by the use of standard printed circuit technology, on the same surface as the prefabricated printed circuit or on an opposite surface.

The production of wire scribed circuit boards in accordance with this invention essentially involves the writing with a continuous wire strand on an insulating substratum to form a desired interconnection pattern comprising discrete or discontinuous wire pieces affixed to the substratum, from point to point. The ends of the wire pieces are connected to conductive terminals such as metal plated holes, solid metal pins, metal eyelets or tubes, and the like, so as to interconnect the wire pieces to each other and/or to external components. The terminals may extend either partially into or through the base and may, if desired, extend above a common plane in which the written conductor lines lie.

The prefabricated wire scribed circuit boards comprise an insulating planar base and a plurality of thin, elongated preformed wire conductors adhered to the base in a common plane and in fixed position relative to each other and to a surface of the planar base. In highly preferred embodiments, at least one and usually a plurality of wire conductors are written in a common plane along an inflected path between two terminals spaced longitudinally and transversely of each other. The path of such written wire or wires, whether inflected or not, is maintained by the adherence of the conductor to the surface of the base, which is free of mechanical features or discontinuities of any type, except for the means adhering the conductors to the surface and the terminals.

The production of inflections in a wire conductor written on a planar surface of a base which is free of posts, pins, holes and other mechanical features at the point or points of inflection will be further clarified by reference to the ensuing description and the drawings.

In writing, the wire is laid down onto or into and simultaneously adhered to the surface of the base from a first to a second point, cut at the second point and then laid down onto or into and simultaneously adhered to the surface of the base from a third to a fourth point, and cut again. This sequence of steps is continued sequentially until the written wire image is completed. The written wire image pattern, from point to point, on one board can be congruently repeated on other boards. Although a variety of means may be used to adhere the wire to the base, including mechanical and chemical adhering or bonding means, best results are achieved by use of an insulating base whose surface itself, or a coating thereon, e.g., an adhesive coating, may be activated chemically, or by other means such as pressure, heat or other form of wave or radiation energy such as light, sound and the like, to adherently receive and fix the wire thereto.

With such a base, as the wire contacts the surface, it is simultaneously activated to adherently receive and affix the wire thereto in the precise form dictated by a predetermined interconnecting pattern. An inflection or inflections in a written wire line may be formed on such an activatable surface by writing the continuous wire strand along a first direction on the surface, simultaneously activating the surface to adherently affix the wire strand thereto along said first direction, thereafter continuing to write the same wire strand along a second direction on the surface at an inflection to said first direction and again simultaneously activating the surface to adherently affix the continuous wire strand thereto along the second direction.

As many inflections in a single wire run as may be dictated by the predetermined pattern may be made. The wire strand may be written and adherently affixed to the surface in curved paths. Similarly, a single wire run may cross over previously written conductor lines. The finished written wire image thus comprises in a preferred embodiment a plurality of discrete wire pieces of varying lengths extending in precise, predetermined directions between terminal points with inflections and/or crossovers along the paths of some of the wire pieces. In addition to the terminals dictated by the ends of the written wire lines, additional terminals may be provided at other points in the board, as will be more clear hereinafter, as by drilling or punching holes through the written wire lines or at other locations.

Whenever a line is written between two terminal points so as to crossover a wire line previously written between the same or different terminal points, the wire must of course be insulated at least at the crossover area to avoid short circuiting.

In the manufacture of the wire scribed boards of this invention, use of insulating wire as the "ink" is preferred.

In actual production of the wire scribed boards, a wire supply means and a dispensing head controlled to receive the wire from the supply means and to feed it continuously onto the surface of an insulating base located in close proximity to the dispensing head are established. The dispensing head and the insulating base are then programmed to move relative to each other so as to lay the wire between the predetermined points onto the surface of the base from one side thereof such that the locus described by the wire laid on the base is essentially congruent with the locus described by the motion path of the dispensing head relative to the base, to thereby form a written wire image of a desired, predetermined interconnect circuit on the surface of the base. Means to mechanically or chemically adhere the wire to the base simultaneously or substantially simultaneously with its contact of the base and cutting means are also provided, as will be made more clear hereinafter.

The manner in which the foregoing and other objects according to the invention are achieved is set forth in the following detailed description of several illustrative embodiments. The drawings form part of the specification wherein.

Figure 1A:
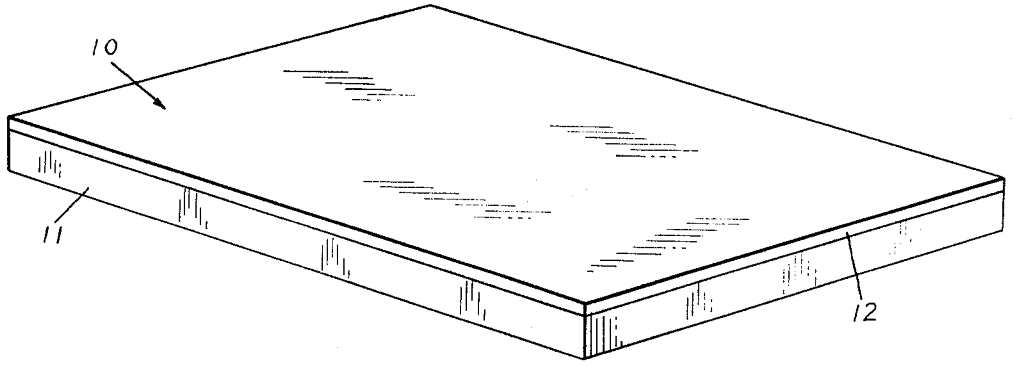
FIGS. 1A–1H are diagrams illustrating step-by-step formation of the wired circuit board.

As is shown in FIGS. 1 to 4 of the drawings, the circuit board 10 includes a base 11 which may be of thermoplastic or thermosetting resinous material or ceramic material, which is preferably reinforced and non-conductive. In the preferred embodiment of the invention, base 11 is coated on the surface upon which the insulated conductors 14 are to be embedded with a thermosetting adhesive 12 partially cured to the "B" stage before the conductors are applied. The conductors 14, before they are applied to base 11, may be coated with a non-conductive coating or insulation 19 which may be a thermoset resin or other suitable insulation, inert to the adhesive coating on the base and to the temperature required to complete the cure of such adhesive coating. Insulation coating of the wire is not essential and, for some boards, non-insulated wire might be preferable. Because the conductors 14, when applied to base 11, may be in close proximity to each other and, in some instances, crossed, one over the other, it is important in selecting the insulated conductor that such insulation remain-non-conductive at the voltages applied to the conductors after the components are added and the circuit board is in use.

Insulated conductors 14 are laid on and embedded in the surface of base 11. This may be accomplished by writing or scribing the conductors onto the surface of base 11 along preprogrammed paths, according to the method described herein or by tacking conductors 14 to the base surface, or partially cured adhesive coating 12 thereon, at spaced points along the conductors. After all of the conductors have been applied, the conductors are pressed into the base surface, or adhesive coating 12 thereon, and the surface or coating is cured. The conductors may be pressed into the surface with a platen and the surface of the board heated to cure the thermosetting adhesive material or the conductors may be heated to cure the thermosetting material into which the conductors are pressed. A heat source sufficient to cure the thermosetting adhesive material, including micro-wave heat sources, e.g., radiation heating, ultrasonic vibrations, etc., may be employed.

The preformed, insulated conductors 14 in the instant invention may be applied to one or both sides of base 11 by writing or scribing the conductors onto the surfaces along pre-programmed paths, as described above, or such conductors may be applied to one surface of base 11 to which, on the other surface of the base, as hereinafter described, a printed circuit pattern is applied. Further, if desired, the wire scribed surface of the board itself could include preformed printed circuit conductor patterns to provide ground connections, voltage connections, fingers and other standard features.

Thus, the insulated, preformed conductors may be wire scribed in accordance with the instant invention on the surface of a panel already provided with printed circuitry whenever additional conductors with respect to such circuitry is desired. In this embodiment, the insulated wire may actually be written over the printed circuitry.

It is preferred, in the practice of the instant invention, to first apply the insulated, preformed conductors to the board surface along a pre-programmed path and to then drill or punch the board at those locations at which terminals are to be located. Such drilling or punching is preferably done from the side of the board upon which the conductors are embedded, to assure clean, conductive ends at the hole walls. Conductive solid pins or sleeves may be inserted into the drilled holes and the exposed wire ends connected to the pins or sleeves, as by welding, diffusion bonding, hot soldering, brazing, and the like, to make strong reliable connections between the wire ends and the connector pins or sleeves. Preferably, as already brought out, the walls of the holes are metallized by pretreating them to render them sensitive to electroless metal deposition as by treatment with seeding solutions of palladium/chloride/stannous chloride, followed by dipping in electroless metal solutions, e.g., electroless copper, nickel or gold solutions, to electrolessly deposit metal on the hole walls and the conductor ends exposed thereat, thereby forming a strong bond between the conductor ends and the metallized hole walls. When a base which is already catalytic to reception of electroless metal, e.g., a plastic base having dispersed throughout particles which are catalytic to the reception of electroless metal, is utilized, the hole walls will be receptive to electroless metal deposition following hole formation. With such a base, the seeding treatment described need not be employed, all as more clearly described in the co-pending applications identified and incorporated herein by reference. When the seeding step is employed, a temporary mask may be superimposed over the board surfaces before seeding and removed after seeding, to prevent electroless metal deposition on the board and wire surfaces. Connections between the components and the connecting terminals produced as described may be made using conventional procedures, e.g., the components may be plugged into the sleeve-type terminals or welded or otherwise attached to the solid pin type terminals.

As later described, the insulated conductors 14 may pass, one over the other. Because such conductors are insulated, the current passing through one conductor does not interfere with the other conductor. This is of particular advantage because it eliminates the need for lamination as has heretofore been necessary. As already pointed out, the conductors 14 are embedded in the board surface and can be repaired or replaced should such repair or replacement become necessary or desirable.

Figures 5, 6, 7, 7A:
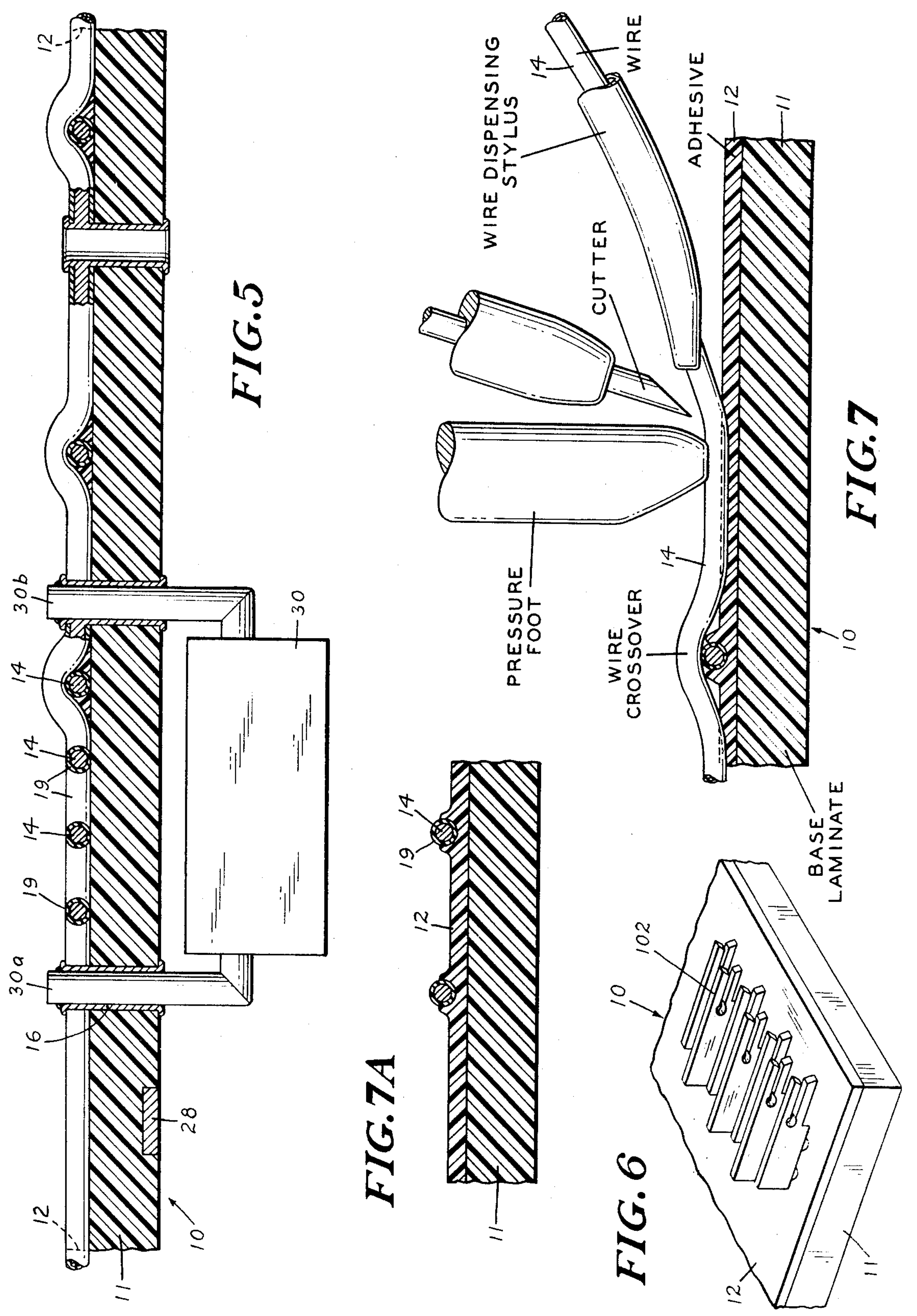
FIG. 5 is an enlarged view showing a section of a circuit board having, on one surface thereof, printed circuitry and, on the other surface, the written wire circuitry of the instant invention, to which board a representative component has been added.
FIG. 6 is an enlarged view of a modified terminal connection for use in place of the terminal fingers of FIG. 3A.
FIG. 7 is a schematic illustration of an embodiment of apparatus for writing with wire upon the surface of a base in accordance with the instant invention.
FIG. 7A is a cross sectional view of a wire written on a base with the apparatus of FIG. 7.

The board of the instant invention may be provided with contact fingers 8 (FIG. 3A) for connecting the board, with its components, to the other circuitry of the chassis or, such boards may be provided with connectors 102 (FIG. 6). Other connection means may, of course, also be employed.

As has been noted above, the insulated, preformed conductors 14 on the board of the instant invention may be in close proximity to each other, thereby permitting a higher concentration of conductors and terminals in a given board area. Such insulated conductors 14 may cross over each other. Because such conductors are insulated but affixed to the board surface, many of the advantages of hand or machine wiring are combined with the advantages and compactness of printed circuits. At the same time, the board of the instant invention can be repaired or modified as by cutting out or adding conductor lines, and the need for stacking and laminating the board and the disadvantages and costs associated therewith are eliminated. The use of preformed wire of cylindrical shape provides a current capacity generally much greater than can be achieved with printed conductor lines having a width equal to the diameter of the cylindrical wire. Conversely, the width of the printed circuit lines must generally be greater than the diameter of the wire of this invention to achieve the same current carrying capacity. Thus, in addition to the advantages associated with the closer spacing permitted by the insulated, preformed conductors of the wire scribed board, such boards also permit a greater number of conductors to be applied to a given circuit board area because the width of the wires to provide a given current carrying capacity may be smaller than the width of a printed conductor.

Although the invention is particularly described with reference to the writing of electrical conductors, i.e., wire, it is to be understood that the teachings herein are also adaptable to the use of optical conductors, where such conductors comprise an optical fiber or bundle of fibers having an exterior surface whose light transmitting properties are different from the light transmitting properties of their interiors. Such a fiber, for example, may be coated with a non-light transmitting coating or insulation which, within the light transmitting range of the conductor core, prevents the escape of light therefrom. The fiber coating may also for example be one which simply has a different index of refraction than does the interior of the fiber.

Referring to the drawings, the wire interconnection pattern is formed on the surface of a substrate as shown in FIG. 1A which consists of a dielectric base 11 coated with an adhesive layer 12. The adhesive layer is preferably in the form of a partially or semi-cured thermosetting resin which is non-tacking at room temperature but, which, upon application of heat below the thermosetting temperature, become malleable and provides an adhesive bond when heated momentarily and cooled. Details as to particular base materials and thermosetting resins which are suitable for formation of a substrate 10 are described in more detail herein above and in the aforementioned co-pending applications.

Figures 1B, 1C, 1D, 1E:
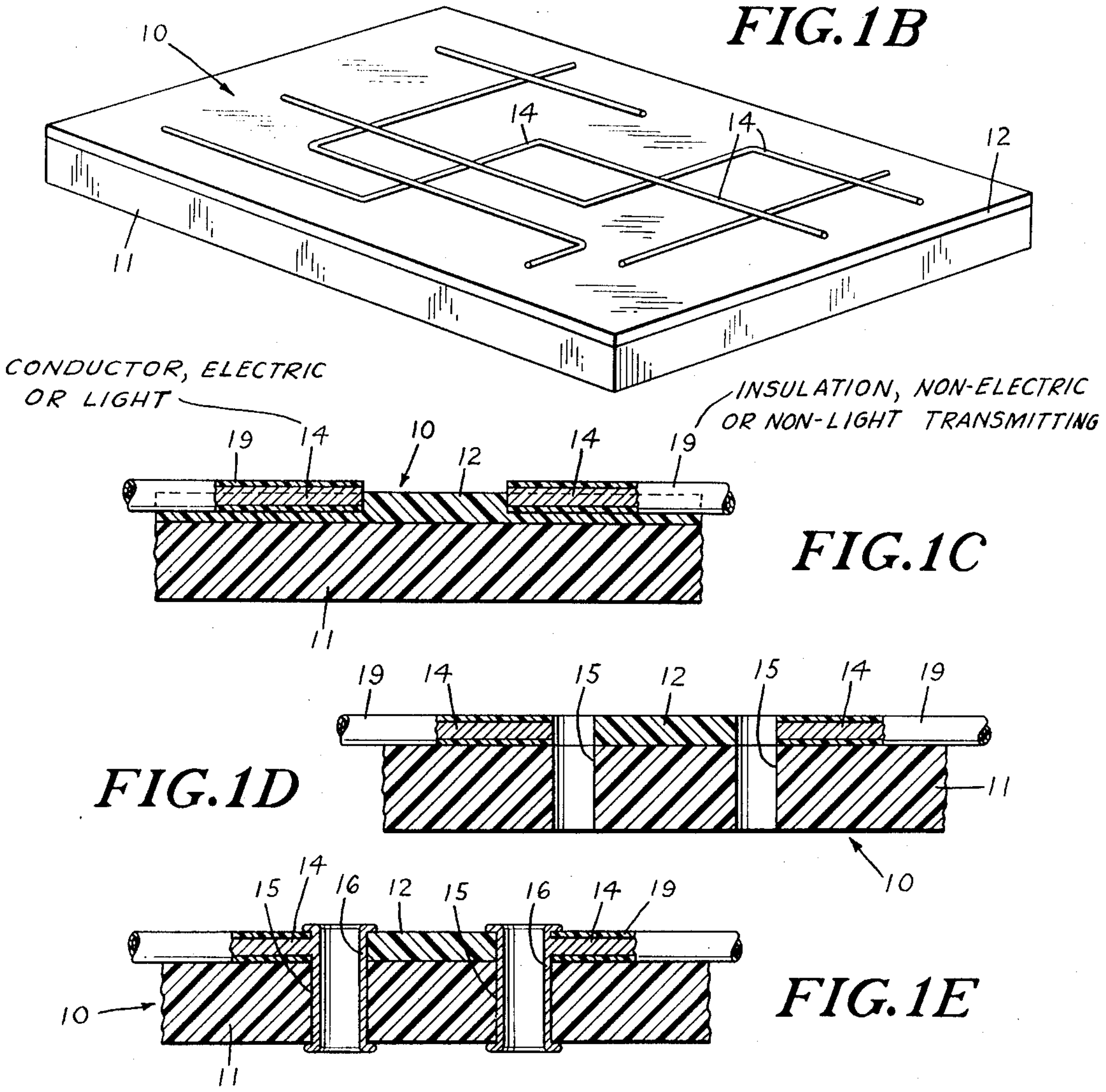

Wire 14 is written and then adhesively attached to the surface of the substrate to thereby form the conductor pattern as is shown in FIG. 1B. This can be achieved by periodically tacking the wire conductors to the substrate as the wire is dispensed following a predetermined pattern or by means of a more continuous bonding that couples the wire to the substrate throughout the conductor length. The temporary bond can be achieved by locally heating the thermosetting resin to soften the resin beneath the conductor and thereby provide an adhesive bond. The temporary bond can also be achieved by heating the thermosetting resin to a malleable state and then molding the resin up and around the conductor to at least partially capture the wire. Advantageously, both physical and adhesive bonding can be used to attach wire 14 to substrate 11.

The conductors of the conductor pattern can be crossed as often as desired in the formation of the conductor pattern and, in order that this might be done without short-circuits in the conductor paths, the conductors are insulated where such conductors cross. Preferably, wire 14 having a continuous insulating coating 19 is used for this purpose and to prevent short-circuiting between conductors layed close together on the base. As a result, an extremely dense conductor pattern can be achieved in a single layer. In most cases sufficient interconnections can be provided in a single layer of conductors but, if additional interconnections are required, this can be easily accomplished according to the teachings of this invention by using both sides of the board.

After the conductor pattern is completed, it is permanently bonded to the substrate. This can be accomplished by pressing the conductor pattern into the substrate, i.e., into the thermosetting resin layer 12, and by then applying the appropriate heat and pressure to fully cure the thermosetting resin. An alternative technique would be to laminate the substrate by addition of a second base layer so that when the two layers are bonded to form the laminate the thermosetting resin layer 12 and the conductors are interior of the completed interconnection board structure. An interconnection board wherein the conductors 14 are permanently bonded by pressing the conductors into the thermosetting resin layer 12 is preferred and is shown in FIG. 1C.

Holes are then drilled into the connection board at locations corresponding to the ends of the individual conductors and at those points along the conductors where terminals are desired so that the exposed ends of the conductors become part of the hole walls. As shown in FIG. 1D, the ends of the conductors 14 become part of the walls of the holes 15 drilled through the interconnection board.

After the holes have been drilled, the holes are metalized to provide metalized coatings 16 which bring the conductor terminations to the surface, as shown in FIG. 1E. The metalizing of the holes can be achieved by treating the base and adhesive layers to render them catalytic by dispersing metal particles throughout to thereby render the surfaces receptive to electroless metal deposition. When the interconnection board is immersed in an electroless plating solution, the electroless metal deposits around the metal particles in the exposed interior surfaces of the hole to build up a coating of the desired thickness.

One technique is to first place a mask on the surface of the interconnection board and then dip the interconnection board into a strong cleaning solution after the holes have been drilled to make sure that the ends of the conductors are not contaminated and to provide a clean metal surface which will make proper contact with the interior metalized surface of the hole. After the interconnection board has been cleaned, the board is immersed in a solution which will seed and sensitize the interior of the holes to render them responsive to electroless metal depositing. Thereafter, the board is dipped in an electroless metal solution so that a metallic coating is developed on the interior of the holes. The mask is removed and additional plating up to the desired thickness may follow.

Although the electric wire assembly boards of the present invention will advantageously have plated through hole terminal interconnections, i.e., terminal interconnections formed by a process in which conductive metal is deposited on the wall of a hole, as by electroless deposition or electroplating, to thereby electrically connect the wire making up the circuitry to the exterior of the board, this invention is broad enough to encompass a wide variety of other interconnections.

For example, in one embodiment projectiles in the form of conducting pins, preferably tapered, could be impelled into the wire scribed boards in accordance with a program to intersect and sever the pre-arranged wire circuitry at predetermined points, and to make electrical contact between the resulting severed ends. This embodiment would eliminate the necessity for pre-drilling or punching holes in the board.

Figure 1F:
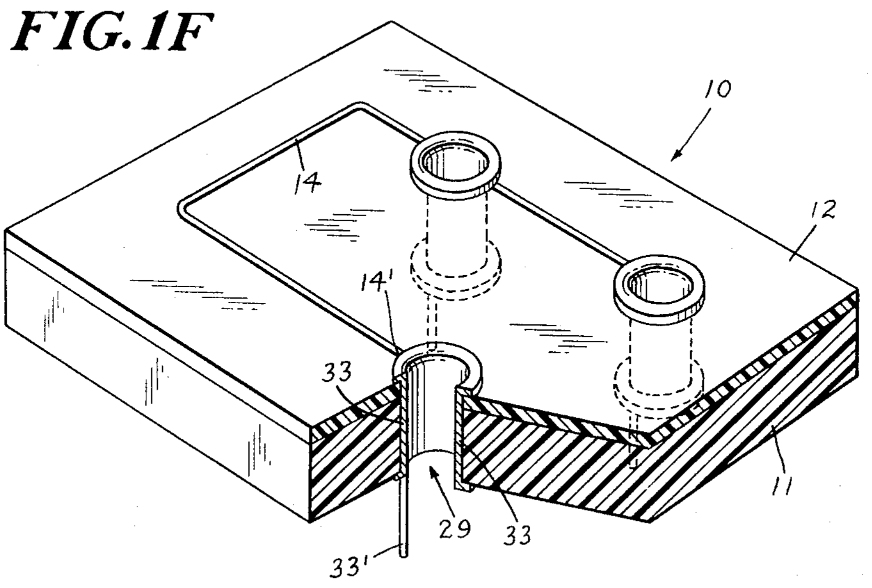
Figure 1G:
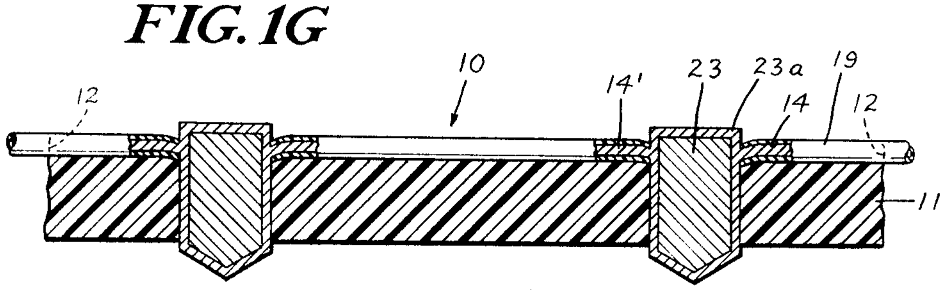

Such an embodiment is illustrated in FIG. 1G wherein projectile pins 23 sever the wire 14 and contact the wire ends 14' to connect the ends to the exterior of the board.

Preferably the projectile pins 23 are coated with a low melting metal, such as tin, indium, solder or the like, as shown at 23*a* in FIG. 1G. After the pins are impelled into the boards, the board may be subjected to a heat treating process above the melting point of the low melting metal, thereby causing the metal coating to melt and to form an integral bond between the wire end 14' and the pin 23. Alternatively, the wire 14 could be coated with a low melting metal, such as tin, indium, solder and the like. It will be seen that absent such a coating of low melting metal, the pins 23 will make wiping contact only with the wire ends 14'.

Figure 1H:
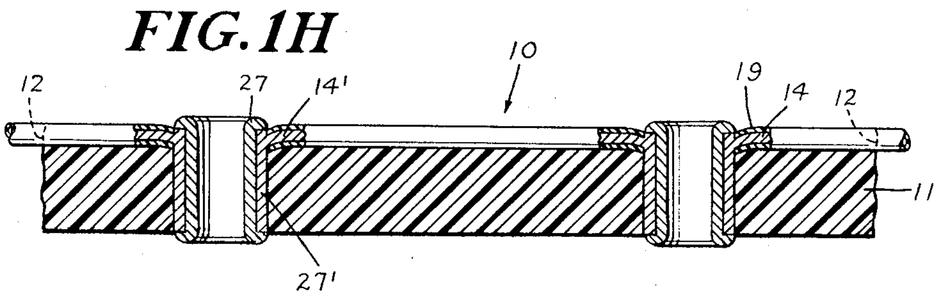

In the embodiment of FIG. 1G, it would of course be possible to provide holes at predetermined points, and to then insert the pins 23 into the resulting holes. The pins 23 could be either solid or hollow, and could take a wide variety of shapes, e.g., cylindrical, conical, hourglass, and the like. When hollow, the pins, if desired, could take the form of a tube eyelet, which after insertion into the pre-formed hole, could be exploded to make good contact with the severed wire ends. Such an embodiment is shown in FIG. 1H wherein 27 represents the exploded eyelet. Here again, the eyelet could be coated with a low melting metal of the type described as shown at 27', such that upon heating of the eyelet, the coating will melt and form an integral connection between the wire end 14' and the eyelet. Here again, the wire 14 could also be coated with a low melting metal. When the tublet or eyelet is hollow, the board could be dip soldered to fill the opening in the tublet or eyelet.

In FIG. 1F is shown still another embodiment of an interconnection which may be used in practicing this invention. In FIG. 1F, an insulating base 11 has superimposed thereon a special insulating wire 14 written in the form of a desired circuit pattern and a plurality of holes, one of which is shown at 29. Each of the holes is provided with a metal eyelet 33 having a pin 33' protruding below the lower surface of base 11. The end 14' of the insulating wire 14 is integrally connected to eyelet 33. In this embodiment, the special wire making up the circuit pattern comprises a conductor, such as copper, coated with a low melting metal or solder, and an insulating coating, such as a polyurethane resin alone or with a nylon overcoat. When exposed to heat, such as with a soldering iron, or a solder pot, the insulating coating peels off and exposes the solder coat, which in turn melts to form a solder connection to eyelet 33. Such an embodiment lends itself readily to wire wrapping of connecting wires and components, such connecting wires and component leads being wrapped around eyelet pin 33' in conventional manner.

As will be clear from the foregoing, the mechanical terminals suitable for use in interconnecting the wire ends of the wire forming the circuit patterns in the boards of this invention may take a wide variety of forms, such as solid or hollow tubes, eyelets, pins, and the like and the terminals and/or the wire may be coated with a low melting metal to enhance the interconnections between the wire end and the mechanical terminal.

Figure 2:
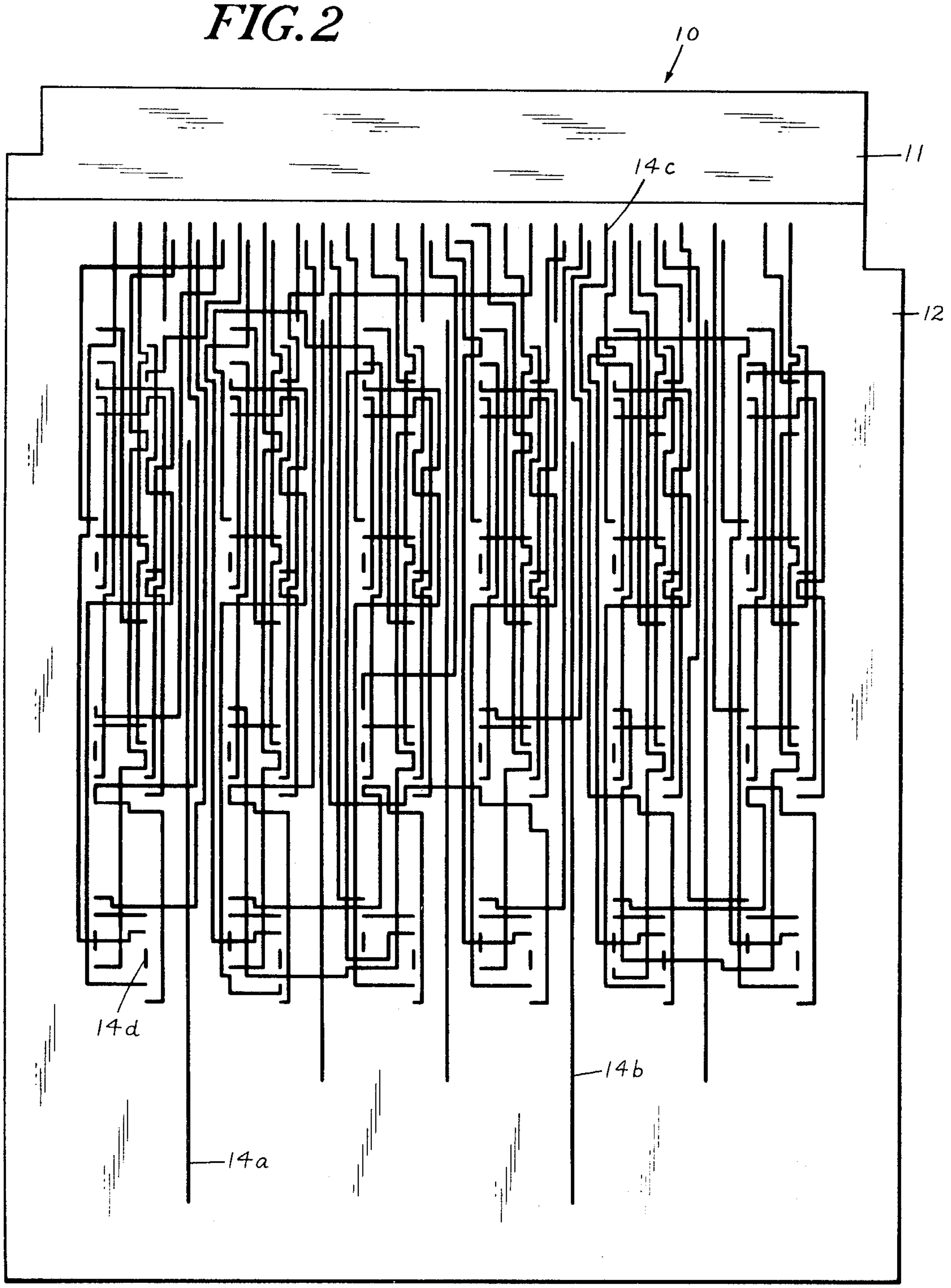
FIG. 2 is a top plan view of a circuit board wired in accordance with the instant invention.

In FIG. 2 there is shown a circuit board wired in accordance with the wire writing technique of the instant invention. Such board is 5 ¼ by 7 inches with wire paths in the circuit layed down on a 50 mil component grid for interconnection of 30 dual in-line packages.

As can be seen by tracing the wires scribed on the board of FIG. 2, such board comprises a plurality of wires of varying length produced by writing upon the surface of an adhesively coated base from one side of such base with a continuous wire strand and then cutting the strand at predetermined intervals in the manner described herein. Certain of the wires, for example wires 14*a*, 14*b*, extending longitudinally of the board between ends or terminals longitudinally aligned. Other of the wires, as an example wire 14*c*, extend in a continuous path, with a number of inflections in such path, and cross over, or are crossed over by other wires. Other wires, as an example wire 14*d*, are relatively short.

Figure 3:
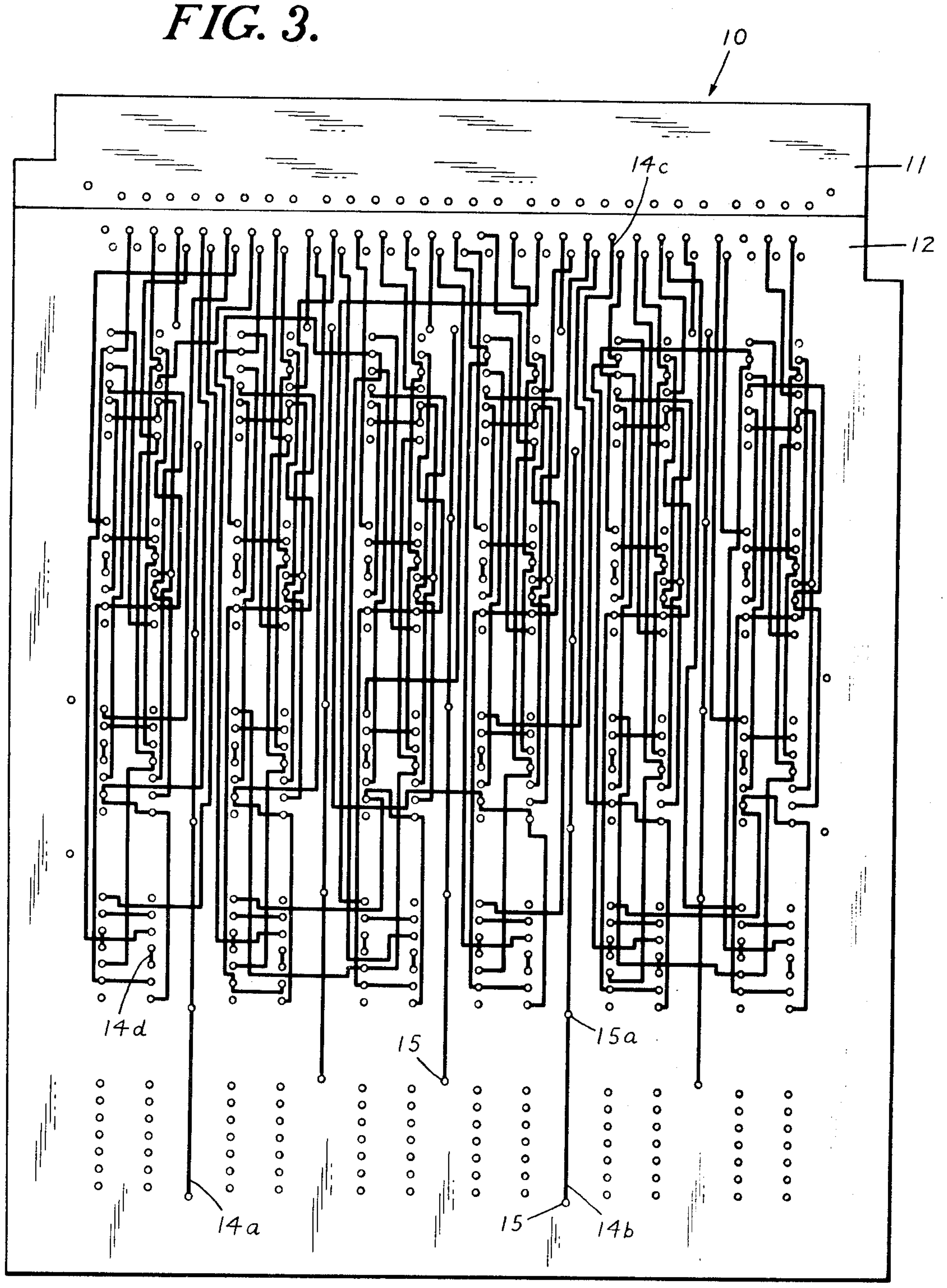
FIG. 3 is a top plan view of the wired circuit board of FIG. 2 after such board has been drilled for terminal connections.

Referring to FIG. 3, the circuit board of FIG. 2 is shown after the board has been drilled with terminal holes or openings. Certain of the holes, as can be seen by tracing of the various wires, are drilled at the wire ends so as to expose the end of the wire in the wall of the drilled hole to form good contact with the terminal connection inserted into the hole. Other of the holes, as an example hole 15*a* in wire 14*b*, intersects the wire and thus divides the wire written onto the board in accordance with the instant invention, into segments at the opposite sides of holes 15*a*. In drilling hole 15*a*, the segment ends are exposed in the hole wall so as to form good contact with the terminal connection inserted thereinto.

The holes drilled in the board, some of which are not connected to or intersected by the wire conductors written on the board surface, are metalized and form terminal points for component insertion and soldering in conventional manner. The wires may be of the order of 3 to 30 mils in diameter, typically 7 mils in diameter, and are insulated with a rugged coating, such as a polyimide, so that not only are the crossovers permitted but short circuits between long runs of closely spaced parallel conductors are prevented. Insulated wires of 7 mils diameter are electrically equivalent to 2 ounce printed copper conductors 14 mils wide or 1 ounce conductors 28 mils wide. The component holes with such wire are typically 42 mils in diameter while the smaller wire interconnect holes are typically 17 mils in diameter.

Figure 4:
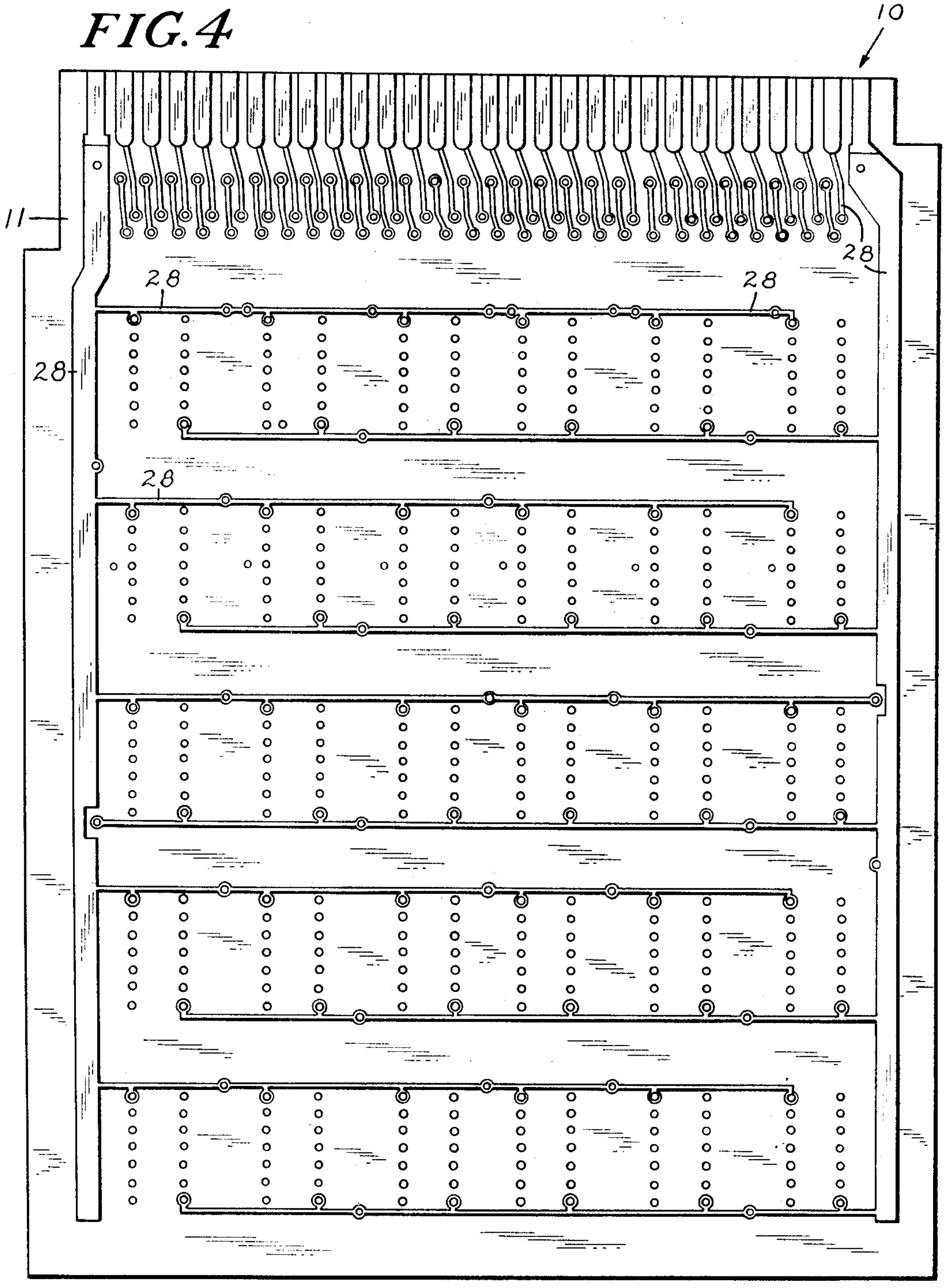
FIG. 4 is a plan view of a printed circuit board to which the wire writing techniques of the instant invention might be applied to superimpose, over the printed circuit, the written wire circuitry of the instant invention or to which such written wire circuitry might be applied to the surface at opposite sides of the printed circuit board.

In general, wire patterns may be written upon the surfaces of boards carrying prefabricated printed circuit conductors or "formats" so that ground connections, voltage connections, fingers, shield areas, and other standard features may be incorporated as part of any standard multiple use format and interconnected with the wire pattern by metalized holes or such wire patterns may be written upon one surface of a board carrying a prefabricated printed circuit on its opposite side. The reverse side of the FIGS. 2 and 3 board illustrates this use of printed circuit conductors 28 in combination with the wire network for ground and power distribution and is shown in FIG. 4. A close view of one of the denser areas of the wire written side of such board, FIGS. 2 and 3, shows the numerous crossovers made possible by the fact that the wire conductors are insulated. This board would normally be a so-called "3 layer" circuit board.

FIG. 5 shows a cross-section of the circuit board of FIGS. 3 and 4 having a wire conductor pattern written on one side of the base and a printed circuit on the opposite base. Wires 14 are adherently affixed to base 11 by thermoset resin layer 12. Component 30, having pins **30*a* and 30*b*, is attached to the board by inserting pins 30*a* and 30*b* through holes 15 so that the pins contact metalized surfaces 16 of the holes and the pins are soldered, welded, or otherwise fixed and electrically connected to conductor wires 14**.

Figure 3A:
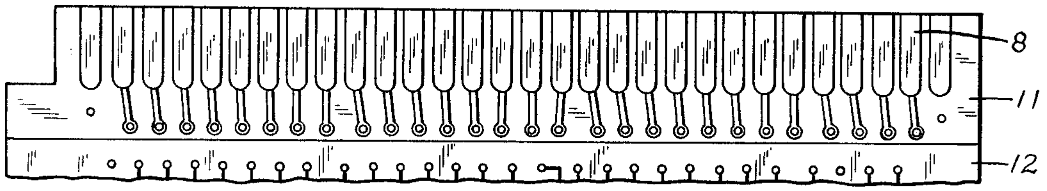
FIG. 3A is a top plan view of the terminal end portion of the board of FIG. 3 after the terminal fingers for use in connecting the board of the instant invention to the other component units of a chassis have been plated thereon.

The wire written circuit board of the instant invention is connected to the circuitry for which components have been added and in which the board is to be used in conventional manner. Thus, as shown in FIG. 3A, the board is provided with connection finger 8 and, in FIG. 6, with connector prongs 102.

Several different procedures have been developed for writing with wire. A preferred embodiment employs ultrasonic energy to bond or inlay the wire into the adhesive coating as the surface is moved under the wiring head by the work table. In this embodiment and with reference to FIG. 7, the wire emerges from the dispensing tube and is drawn under an ultrasonically energized pressure foot by the motion of the work, thereby activating or softening the surface of the base contacted by the wire. Positive feeding of the wire while such wire is being written onto the base surface is neither needed nor desirable. The dispensing and bonding system has sufficient vertical compliance to allow the wire to pass with no difficulty over other wires which have already been written onto the surface. The physics of the system is such that the wire 14 is embedded into the adhesive surface 12 to a depth of about half its diameter. The adhesive on the surface displaced by this action forms a small "furrow" or "fillet" on either side of the wire, as shown in FIG. 7A, to provide a particularly improved bond of the wires to the base.

The ultrasonic bonding system appears to have the potential of operating up to linear speeds which are so high that they are not a practical factor in the machine design. One such wiring head pressure foot operates at a power level of about 10 watts at 20 kcps and produces excellent bonds at speeds up to at least 3 inches per second. Much higher speeds, up to about 10 inches per second or higher, may be attained.

The orientation of the dispensing tube is always parallel to the direction of motion of the work surface. In a typical embodiment of the FIG. 7 type apparatus, eight directions or vectors for plotting the wire are provided although four are adequate to almost all pattern requirements.

In addition to the ultrasonic pressure foot, the writing head contains mechanisms for initiating a "new" wire and cutting an "old" one. Cutting is accomplished by bringing a blade across the end of the feed tube between the end of the tube and the pressure foot. Starting a new wire is accomplished by power feeding a short length of wire from the feed tube under the pressure foot with the foot retracted, lowering the foot, and applying ultrasonic energy to embed the wire into the adhesive.

The direction in which the wire is to be laid onto the base is determined by the direction in which the work table is moved relative to the wiring head and by rotating the wire feed system to the appropriate direction for plotting.

The wiring head writes the wire pattern under automatic control. In the writing process, the head must be able to feed, place upon and affix to the board surface the start of a wire so as to begin a new line; it must cause the wire to adhere to the board throughout the line length; it must form and guide the wire at any inflection point where the line direction is changed; and it must interrupt or cut the wire so as to end the line. As a result of such wire manipulative steps, the path of the wire laid down on the board is essentially congruent with the path described by the writing head moving over the board. Many of the desirable properties of the wire scribed circuit boards are derived from this feature of wire writing. Because they are written onto the board surface under automatic control, the relative locations of all points of the conductors with respect to each other and with respect to the termination holes are not only known and reproducible but may be specified in advance by numerical data. The basic procedure utilized in producing the boards may also be though of as wire plotting.

The bonding system should have the potential of operating up to linear speeds as high as the speed of machine production. The primary limitation on system speed is established by machine components and the usual compromises involving speed versus accuracy, dead time overheads, etc., and is not limited by the bonding system.

The process of manufacture may be summarized by saying that the automatic controlled work table responds to position commands in X or Y. Each position represents either the start of a wire, the end of a wire or an intermediate inflection point. The machine positioning motion between successive points is linear. Simultaneous motion in X and Y is also permissible if the incremental distances are equal so that the path direction is a multiple of 45°, when eight motion directions or vectors are provided. The wiring head responds to control commands which are conveyed by so-called M-functions associated with the X and Y commands as will be subsequently explained.

When the wiring pattern is completed the part is removed from the wiring machine and placed into a press for about 3 minutes at a suitable temperature. This operation causes the entire wire matrix to be firmly embedded in the adhesive surface. The adhesive is then cured by baking for the required cure time and temperature cycle, e.g., 325° F. for an hour when epoxy is used as the adhesive.

As previously mentioned the wiring station accepts position commands in X and Y and M-functions for the wiring head controller. The physical data format utilized may be punched paper tape. As is conventional for most NC systems, each block contains a sequence number, X data, Y data and X function data.

The wiring control commands contained in the M-functions can specify the following, for example:

1. Rotate feed system clockwise one, two, three or four 45° steps.
2. Rotate feed system counterclockwise one, two or three 45° steps.
3. Feed new wire.
4. Lower pressure foot.

5. Raise pressure foot and cut wire.

Producing the proper command sequence for a job is quite similar to NC parts programming and may be done using techniques of any sophistication extending upward from the brute force pencil and paper level.

Post-processors to translate this format to the actual wiring station control tape may be written in appropriate computer language to run from paper tape to paper tape or listing, unit record card to paper tape or listing, and disk data file to paper tape or listing for a computer system.

The wiring station data base format is extremely convenient as the interface point for the outside world since it is directly compatible with and/or can be the direct output from any conceivable digital design or tooling process.

Thus, the wiring station may be programmed via a simple post-processor from a data base. For example, the data format may be a three word record of the form

IC IX IY where

IC is an operation code: if IC = 1 the record is a "new wire" and if IC = 0 the record describes a wire inflection or end point;

IX is the X distance of the point from board datum in mils; and

IY is the Y distance of the point from board datum in mils.

Within this context, and illustratively, the following records would wire a square 100 mils on a side at the datum in a counterclockwise direction.

| | | |
|---|---|---|
| 1 | 0 | 0 |
| 0 | 100 | 0 |
| 0 | 100 | 100 |
| 0 | 0 | 100 |
| 0 | 0 | 0 |

The basic components of one machine for writing with wire are described in FIGS. 8–14, which are taken from co-pending application Ser. No. 865,008 referred to hereinabove.

The substrate 10 is mounted on a movable table 17 controlled by a table drive 18 having 2° of freedom. The board can therefore be moved incrementally in any one of four directions as controlled accurately by movement of the table according to a predetermined program coordinated with the movements of the tacking apparatus shown in FIG. 9.

The insulated wire 20 passes through a wire guide 21 so that the wire emerges from the guide and passes beneath a U-shaped opening 22 of a tacking head 24. The tacking head is shown in a retracted position but if forced downwardly when it is desired to tack the wire to the substrate. A heating coil 25 is thermally coupled to the tacking head and maintains the tacking head at a temperature sufficient (1) to partially cure the thermosetting resin coating 12 of the substrate 10 and (2) to heat the resin coating sufficient to place it in a malleable state so that it can be molded to at least partially capture the wire.

A cutter 26 is located adjacent the tacking head, between the tacking head and the end of wire guide 21. The cutter can have a chisel like shape and is attached to apparatus which controls the up and down motion. The cutter is shown in the retracted position but, at the end of a conductor run, the cutter is actuated downwardly against the board so the wire is cut just beyond the last tack of a particular conductor run.

To begin a new conductor run it is necessary to advance the wire so that the end of the wire is beneath the tacking head. This is achieved by an initial wire feed mechanism 30 which includes the rollers 31 and 32. Roller 32 is urged toward roller 31 to engage the wire and the rollers are then rotated a fraction of a revolution just sufficient to advance the wire the desired amount. Thereafter, the roller 32 moves away from the wire so that the wire can feed freely through the wire guide.

Once the end of the wire is positioned beneath the tacking head by the initial wire advance mechanism, it can be tacked to the substrate by tacking head 24. Thereafter, movement of the table draws the wire through the wire guide and the wire is periodically tacked to the substrate by the tacking head. Right angle bends are formed in a conductor run by tacking the wire, rotating the tacking assembly 90°, and by then advancing table 17 in a new direction.

Figures 8, 9:
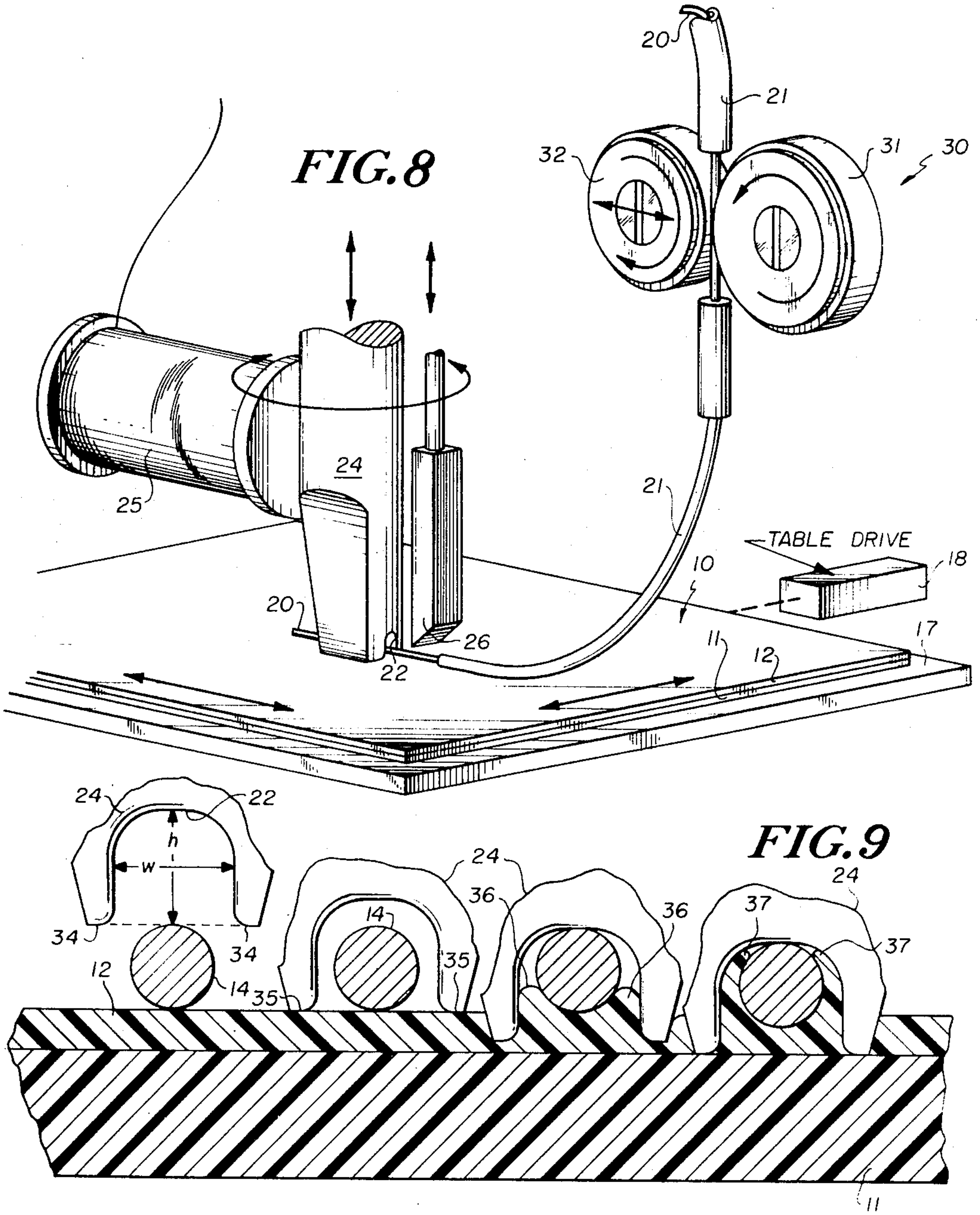
FIG. 8 is a perspective view, in greater detail, of apparatus for use in writing wire in accordance with the instant invention.
FIGS. 9, 9A and 9B are enlarged views showing, at various stages, the adhesion of the wire to the board produced with the apparatus of FIG. 9.

The U-shaped opening of the tacking head is dimensioned having a height ($h$) as shown in FIG. 9 which is somewhat less than the diameter of the wire plus the thickness of resin coating 12. The resin coating may have a thickness on the order of 3–4 mils and the wire diameter (including insulation) may be on the order of 7 mils. Under these circumstances, the height ($h$) would be on the order of 9 mils. When the tacking head moves to its lowermost position where the legs 34 of the tacking head contact the dielectric base 11, the conductor 14 is pushed part way into the resin coating.

The width ($w$) of the opening is somewhat greater than the diameter of the conductor 14. For a wire diameter of 7 mils, the width ($w$) of the U-shaped opening is somewhat tapered so that the width is approximately 9.5 mils at the upper end and gradually increases to a width of approximately 11 mils at the lower portion. The inner edges of legs 34 are preferably rounded as in the upper portion of the U-shaped opening 22.

As the tacking head moves downwardly it contacts the coating 12 at points 35 as shown in FIG. 9 and beings to heat the resin coating. The resin becomes malleable and, therefore, further downward movement of the tacking head begins to build up the mounds 36 as the resin is forced upwardly around the conductor inside the U-shaped opening. When the tacking head reaches the fully extended position with the legs 34 in contact with the dielectric base 11, the protrusions 37 are formed extending from the base upwardly around the conductor beyond the horizontal diameter.

Figure 9A:
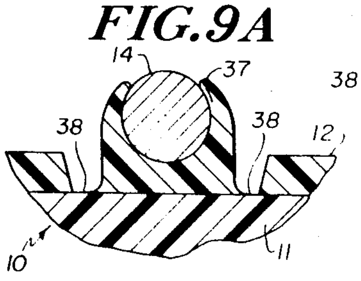
Figure 9B:
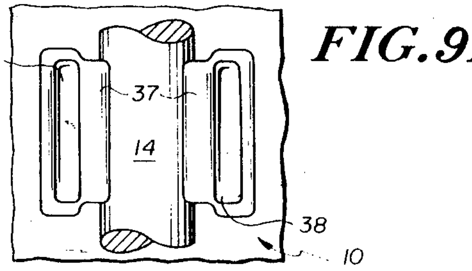

The completed tack appears as is shown in FIGS. 9A and 9B with the protrusions 37 extending upwardly and around the conductor to physically capture the conductor and thereby bond it to the base. Also, the conductor is largely surrounded by the thermosetting resin which has become adhesive when heated and, therefore, an adhesive bond exists between the conductor and the base. The depressions 38 are formed by the legs 34 of the tacking heat when the resin material is forced upwardly to form the protrusions 37. Accordingly, as shown in FIGS. 9A and 9B, the conductor 14 is adhesively bonded to the base and is also captured and thereby physically bonded to the base.

Figure 10:
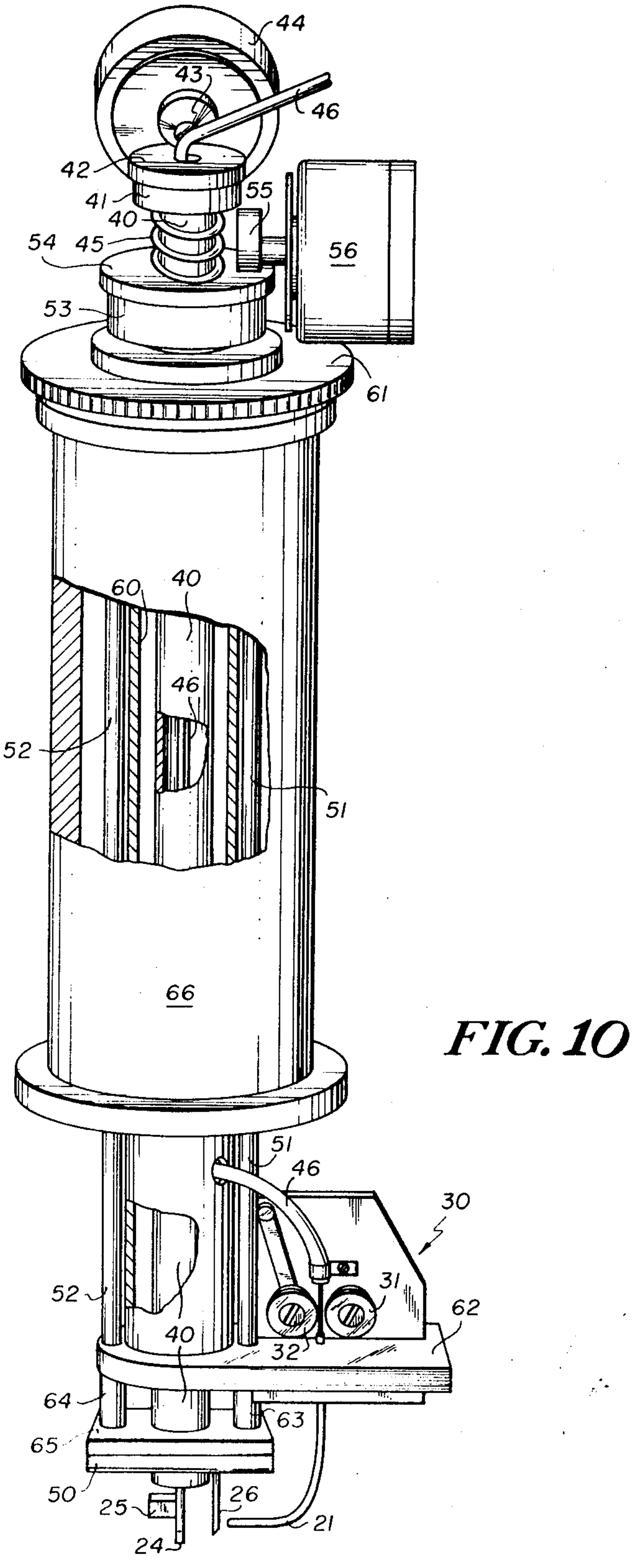
FIG. 10 is a more complete perspective illustration of the apparatus of FIG. 9 with portions broken away for clarity of illustration.

In the formation of conductor patterns the wire is drawn through the wire guide beneath the tacking head by the movement of the table and therefore the assembly as shown in FIG. 8 is constructed so that it can be rotated through 360° to provide wire feeding and tacking in anyone of four directions corresponding to the four possible directions of movement. FIG. 10 is a simplified illustration showing the manner in which the tacking and feed mechanism are actuated while permitting the desired rotation of the tacking assembly.

Tacking head 24 and heater 25, are mounted at the lower end of a hollow shaft 40 having an end cap 41 and pressure ring 42 secured to the upper end. The pressure ring provides a cam follower surface for an eccentric cam 43 mounted on the shaft of a rotating solenoid 44. Shaft 40 is maintained in its normal retracted position by spring 45. When the solenoid is energized the solenoid shaft turns 90° forcing shaft 40 downwardly to compress spring 45. When de-energized, the solenoid returns to the initial position due to a return spring in the solenoid and, hence, shaft 40 returns to the retracted position. Shaft 40 can rotate about its axis and cam 43 acts against the cam follower surface provided by pressure ring 42 regardless of the shaft position.

A Teflon tube 46 extends from the initial wire feed mechanism 30 up through the center of hollow shaft 40 and emerges through a center opening in end cap 41 and pressure ring 42. Therefore wire can be supplied to the feed mechanism through tube 46 in the center of the structure regardless of the angular position of the tacking assembly.

The cutter 26 is secured extending downwardly from the lower surface of a cutter plate 50. The cutter plate is secured to a pair of rods 51 and 52 which extend upwardly and are attached to a pressure cup 53 and pressure ring 54 at their upper ends. Pressure ring 54 provides a flat cam follower surface for an eccentric cam 55 mounted on the shaft of a rotary solenoid 56. When solenoid 56 is energized the associated cam rotates 90° and therefore forces the pressure ring and rods 51 and 52 downwardly against spring tension. As a result, cutter plate 50 and cutter 26 are momentarily forced downwardly against the interconnection board to cut the wire.

A hollow cylinder 60 surrounds hollow shaft 40. A gear 61 is secured to the upper end of cylinder 60 and a feed mount 62 is secured to the lower end of cylinder 60 to support initial feed mechanism 30. Hollow spacers 63 and 64 secure a cutter mount 65 below the feed mount and rods 51 and 52, which are attached to the cutter and cutter plate, pass through the center of spacers 63 and 64 respectively. Shaft 40 attached to the tacking head passes through the center of cutter mount 65 and cutter plate 50.

Stationary cylinder 66 surrounds shaft 40, cylinder 60 and rods 51 and 52. As will be described hereafter in more detail, stationary cylinder 66 is securely mounted to support the tacking assembly. Rotational movement for the tacking assembly including the tacking head, cutter, and initial wire feed can be achieved through rotation of cylinder 60 by means of gear 61. Shaft 40 which actuates the tacking head 24 and rods 51 and 52 which actuate cutter 26 rotate with cylinder 60.

Figure 11:
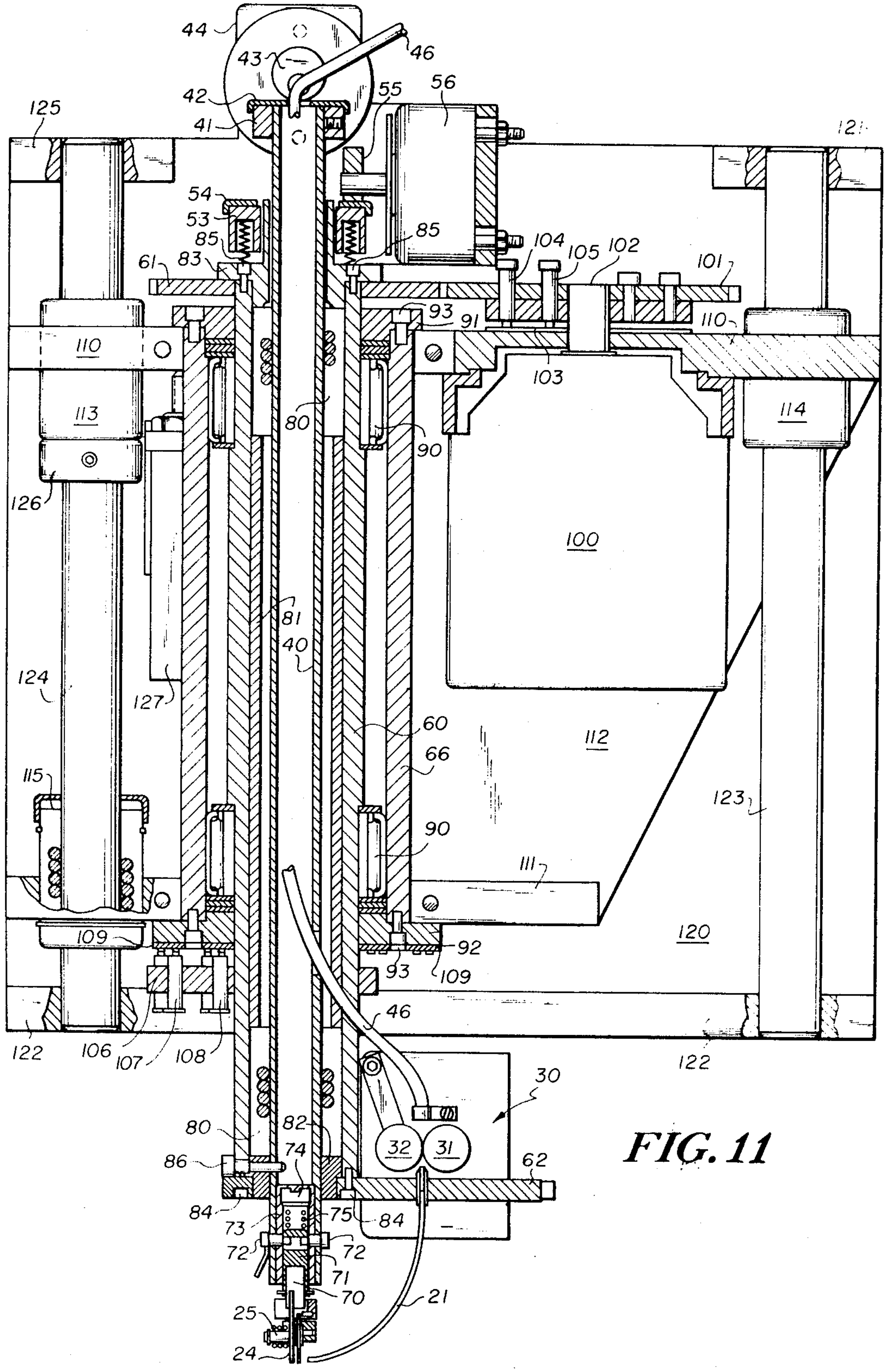
FIGS. 11 and 12 are front and side views, respectively of the apparatus of FIG. 11.
Figure 12:
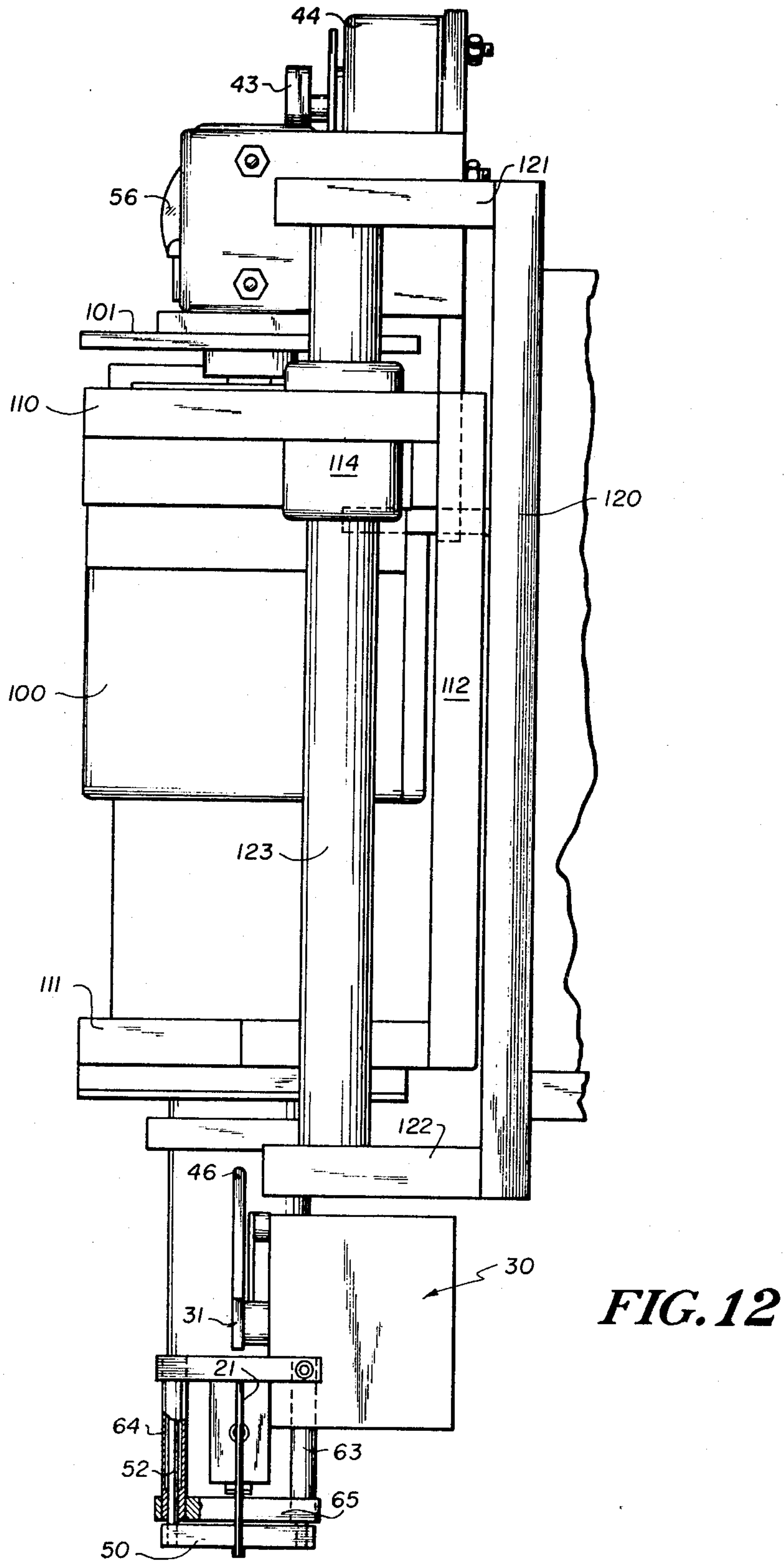
Figures 13, 13A, 13B, 14:
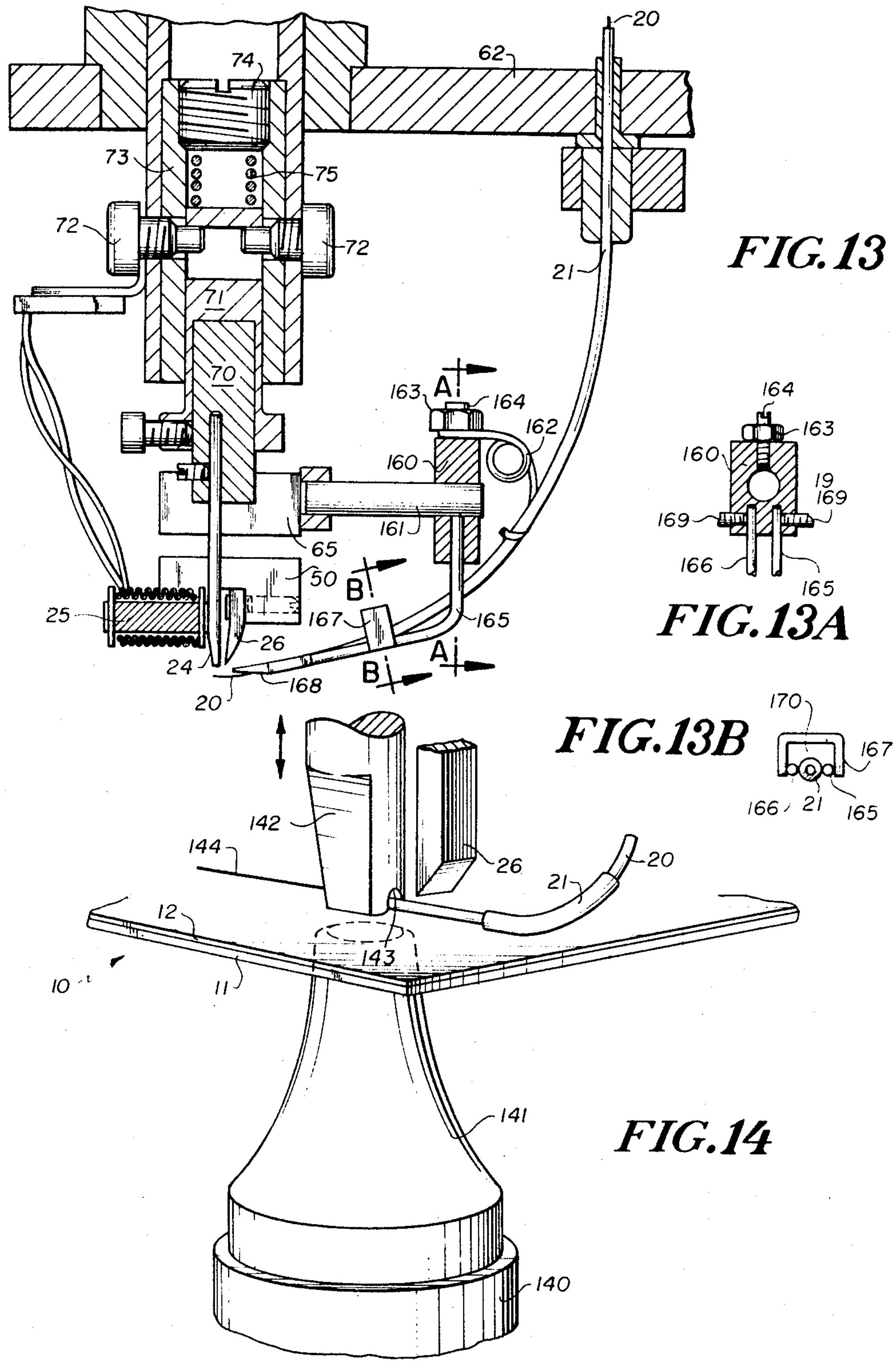
FIGS. 13, 13A and 13B are cross-sectional views showing details of the wire writing head and the associated wire guide, FIGS. 14A and 14B being cross sections taken along lines A—A and B—B respectively.
FIG. 14 is a perspective illustration of an alternative wire writing head structure incorporating an ultrasonic transducer.

The complete tacking apparatus is shown in FIGS. 11 and 13 which are front and side views respectively.

The tacking head 24 is mounted in a pressure cup 71. A pair of guide pins 72 extend inwardly through the walls of shaft 40 and extend into an oval opening within pressure cup 71 to thereby permit movement of the tacking head relative to shaft 40. A guide cylinder 73 is secured within the enlarged opening at lower end of shaft 40 and a set screw 74 is threaded into the upper end of the guide cylinder. A spring 75 is located between the set screw and pressure cup 71 to urge the pressure cup to the extended position against guide pins 72. Contact of the tacking head against the interconnection board tends to urge the tacking head upwardly into shaft 40 and therefore the contact pressure of the tacking head against the interconnection board is controlled by spring 75 and the adjustment of set screw 74.

Shaft 40 is mounted within cylinder 60 to permit an up and down motion of the shaft relative to the cylinder. A pair of ball bushings 80 are located within cylinder 60 surrounding shaft 40. The bushings 80 are separated by a cylindrical spacer 81. The feed mount 62 is secured to the lower end of cylinder 60 by machine screws 84 and holds a bushing retainer 82 in place within the lower end of cylinder 60. Gear 61 is secured to the upper end of the cylinder by a hollow gear shaft 83 which is held in place at the upper end of the cylinder by screws 85. Gear shaft 83 extends into the upper end of cylinder 60 and provides an upper bushing retainer surface. A guide pin 86 is located near the bottom cylinder 60 and fits within an oval opening in the wall of shaft 40, to permit an up and down motion of shaft 40 relative to the cylinder but, at the same time to prevent rotational movement of the shaft relative to the cylinder.

Thus, when rotary solenoid 44 is actuated, cam 43 forces shaft 40 downwardly as permitted by bushings 80 and guide pin 86. When tacking head 24 engages the surface of the interconnection board, spring 75 is compressed thereby controlling the downward pressure applied through the tacking head.

The upwardly extending cylindrical portion of gear shaft 83 provides a centering guide for pressure cup 53 and pressure ring 54. Springs are located in suitable openings in the lower surface of pressure cup 53 and these springs bear against the horizontal surface of the gear shaft to maintain pressure cup 53 and pressure ring 54 in contact with cam 55. For convenience the rods 51 and 52 which extend between pressure cup 53 and cutter plate 50 are shown located within cylinder 66 in FIG. 10 whereas in the actual construction the rods pass through suitable grooves machined into the wall of cylinder 60. Also, in the actual structure, the rods 51 and 52 are preferably disposed front and back rather than at the sides as shown in FIG. 10.

The cylinder 60 includes a center increased diameter portion which provides shoulders for roller bearings 90 which permit rotation of cylinder 60 relative to the stationary outer cylinder 66. The roller bearings are maintained in place by end plates 91 and 92 which are secured to the upper and lower ends, respectively, by screws 93.

Rotational movement of cylinder 60 is controlled by a motor 100 having a gear 101 mounted on the motor shaft 102. Teeth of gear 101 engage and mesh with the teeth of gear 61 secured to rotating cylinder 60. A pair of brush holders 104 and 105 are mounted for rotation with gear 101 and maintain a pair of brushes in contact with a stationary switch plate 103 to provide position sensing for rotating cylinder 60. Four radial conductor bars (not shown) angularly spaced 90° apart are located flush with the upper surface of the switch plate. When gear 101 is located in one of the four positions corresponding to the conductor bars, a circuit is completed between the brushes which is used to develop a feedback signal for positioning the rotating cylinder.

Two pairs of brush holders 107 and 108 are mounted in a brush holder plate 106 secured to the lower portion of cylinder 60. Brush holders 107 urge a pair of brushes into contact with a pair of angular slip rings on a circuit plate 109 secured to a stationary end plate 92. These stationary slip rings are energized and electrical energy is transferred to the brushes to energize heater 25 which rotates with the head assembly. Brush holders 108 similarly urge a pair of brushes into contact with another set of slip rings on circuit plate 109 to provide energization for initial feed mechanism 30.

The entire head assembly is movable vertically so that it can be moved up and out of the way when interconnection boards are being inserted or removed on the digital table below. Upper and lower clamping plates 110 and 111 extend horizontally from a base plate 112. Each clamping plate is a two-piece assembly which fits around and clamps stationary cylinder 66 when bolted together. Motor 100 is mounted on clamping plate 110. A pair of linear bearings 113 and 114 are mounted in plate 110 and another linear bearing 115 is mounted in plate 111.

A stand 120 for the assembly includes an upper bracket 121 and a lower bracket plate 122 which holds a vertical shaft 123 which cooperates with linear bearing 114. Another vertical bearing shaft 124 is secured between upper bracket 113 and 115. Therefore, the entire assembly mounted on base plate 112 and clamping plates 110 and 111 can be moved up and down relative to the stand 120 as the linear bearings slide up and down on bearing shafts 123 and 124. An adjustable stop 126 secured to shaft 124 determines the lowermost position. An air cylinder 127 is utilized to raise the assembly.

In the foregoing illustrations the details of the wire guide have been omitted but are shown in FIGS. 13, 13A and 13B. The wire guide is designed to permit some up and down motion while maintaining contact with the surface of the interconnection board so that it can ride over conductors which may have been previously secured to the surface of the board. At the same time however, lateral movement of the wire guide is substantially eliminated so that bends in the wire can be formed accurately and the wire is maintained in accurate alignment with the U-shaped opening in tacking head 24.

A guide mount 160 is secured to the cutter mount 65 by means of a rod 161. A support spring 162 at one end is wrapped around a stud 164 and held in place by a nut 163, the free end of the support spring being looped around wire guide 21. Guide arms 165 and 166 are secured in suitable apertures in the guide block by set screws 169 and extend downwardly and toward the tacking head. The laterally extending portions of guide arms 165 and 166 are maintained on opposite sides of wire guide 21 by a U-shaped bracket 167 held in place with Epoxy cement 170.

The end of wire guide 21 is cut on a diagonal at 168 to naturally conform to the surface plane of the interconnection board. The end of the wire guide can move up and down due to the flexibility of the wire guide and the relative freedom of movement in this direction between guide arms 165 and 166. The guide arms however act as restraints which preclude any significant lateral movement.

An alternative tacking head structure is shown in FIG. 14 wherein an ultrasonic transducer 140 is used in place of heater 25. The transducer is of conventional design and is energized from a suitable high frequency source, e.g., 20,000 kilohertz. The ultrasonic energy is coupled to the adhesive layer 12 and tacking head 142 through a titanium horn 141 to thereby locally heat layer 12 in the vicinity of the tacking head to the desired malleable and adhesive state. This tacking head structure is particularly advantageous where generally continuous tacks 144 covering substantial portions of the conductor run are desired. Tacking head 142 is dimensioned similar to tacking head 24 (FIG. 8), although, when used for continuous tacking operations, the U-shaped opening 143 is preferably flared outwardly and rounded at the leading edges adjacent cutter 26. The remainder of the tacking assembly is essentially the same as previously described.

Figure 15:
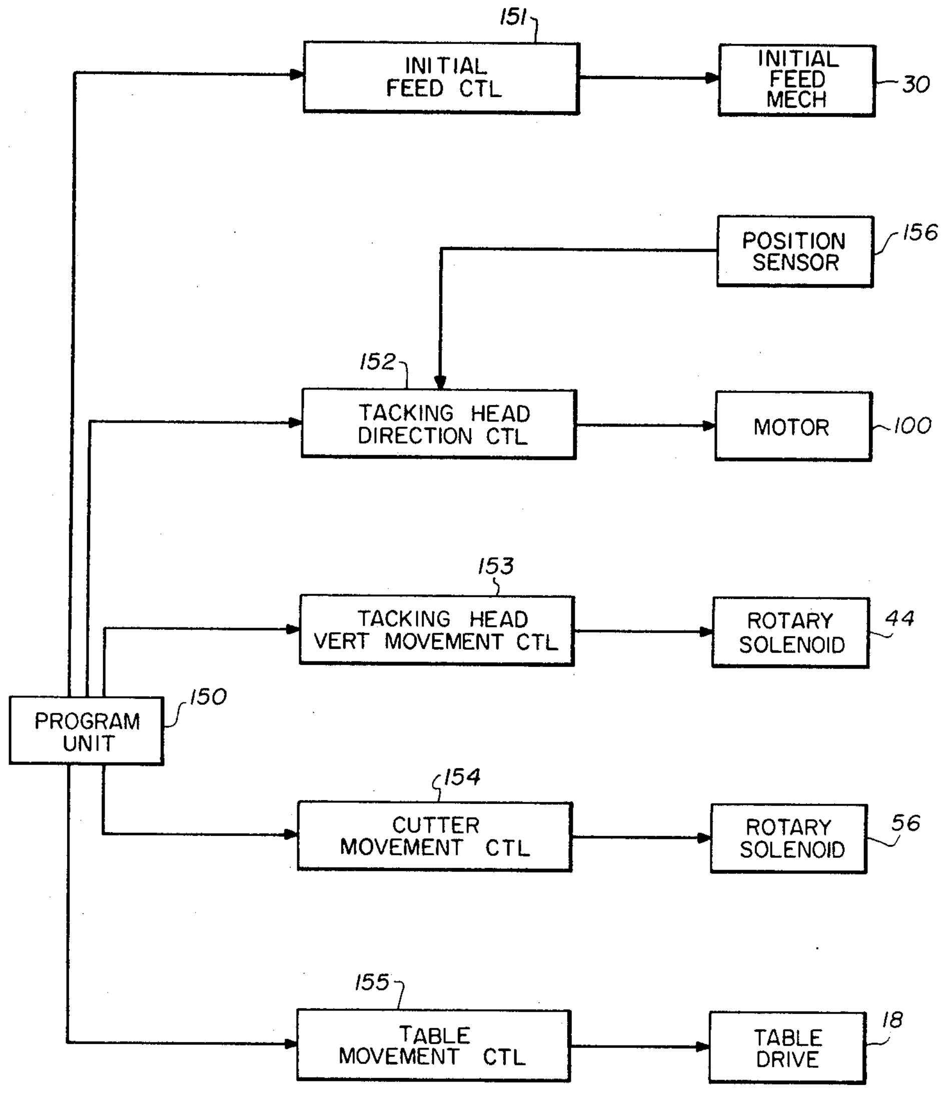
FIG. 15 is a block diagram of the control system for the tacking apparatus.

The tacking apparatus shown in FIGS. 8–14 is controlled digitally according to a program on magnetic tape, paper tape, punch cards or the like which are supplied to a program unit 150 shown in FIG. 15. Control units 151–155 operate in accordance with the program to control, respectively, initial feed mechanism 30, motor 100, rotary solenoids 44 and 56, and table drive 18. Position data for tacking head direction control unit 152 is developed by a position sensor 156 including the brushes associated with brush holders 104, 105 and switch plate 103 (FIG. 11).

In a typical sequence of operations the program unit first sends instructions to table movement control unit 155 which in turn positions table 17 (FIG. 8) by means of table drive 18 at the initial position for a conductor run. Instructions are also sent to tacking head direction control unit 152 to operate motor 100 and thereby orient the tacking apparatus in the proper direction for the forthcoming conductor run. Next, the initial feed control unit 151 receives instructions to actuate initial feed mechanism 30 to advance the wire so the free end is located beneath the tacking head. When this is accomplished rotary cam 44 is energized via tacking head vertical movement control unit 153 to tack the free end of the wire to substrate 10 (FIG. 8).

Once the free end of the wire is secured, movement of the table pulls the wire past the tacking head. Instructions are sent alternately to table movement control unit 155 to provide incremental movements and to tacking head vertical movement control unit 153 to tack the conductor to the substrate between successive incremental movements. If it is desired to change direction during a conductor run, tacking head directional control unit 152 is activated following a tack to bend the wire 90° and to orient the tacking assembly for the next set of incremental movements.

Cutter movement control unit 154 receives instructions to energize rotary solenoid 56 after the last tack of a conductor run has been completed. The sequence of operations is then repeated for other conductor runs.

If a tacking head such as shown in FIG. 7 is used to provide continuous tacks, the program would be similar except that tacking head vertical movement control unit 153 would be arranged to maintain the tacking head in the down position during straight portions of the conductor runs and raised only when changing direction or after completion of a conductor run.

The apparatus shown in FIGS. 8 to 15, inclusive, and described hereinabove are included herein to aide in a full and complete understanding of the circuit board and method for the making thereof to which the claims of the instant application are directed. Such apparatus of FIGS. 8 to 14 is shown and described in U.S. Application Ser. No. 865,008, filed in the U.S. Patent Office on Oct. 9, 1969 in the names of Raymond J. Keogh and Frank Wilzek, and no claim is herein made to the invention claimed therein.

The terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A circuit board comprising an insulating planar base, a plurality of longitudinally and transversely spaced points on the surface of said base each defining a terminal point, a plurality of thin, elongated, preformed conductors, at least one of said conductors having an insulating coating extending along its length, means adhering said plurality of conductors to said surface of said base in a common plane and in fixed position relative to each other and to said terminal points, at least one of said plurality of conductors extending in said common plane along an inflected path between a pair of terminal points spaced longitudinally and transversely from each other, said adhering means adhering the inflected conductor to the surface of said base including means at the inflection of said conductor in said inflected path for adhering said inflected conductor at said inflection to said base, at least one of said conductors extending between a pair of terminal points crossing over a second conductor extending between a second pair of terminal points, said crossing conductor being insulated from each other where said conductors cross by the insulating coating extending along the length of at least one of said crossing conductors.

2. A circuit board as recited in claim 1 in which said conductor is a light transmitting optical fiber.

3. A circuit board as recited in claim 2 in which said insulating coating is a non-light transmitting coating.

4. A circuit board as recited in claim 3 in which said adhering means is an adhesive coating on the surface of said base.

5. A circuit board as recited in claim 4 in which said adhesive coating adhering said conductors to said base is a thermosetting coating.

6. A circuit board as recited in claim 5 in which said conductors are at least partially embedded in said thermosetting coating.

7. A circuit board as recited in claim 1 in which said conductor is an electrical transmitting wire.

8. A circuit board as recited in claim 7 in which said adhering means is an adhesive coating on the surface of said base.

9. A circuit board as recited in claim 8 in which said adhesive coating adhering said conductors to said base is a thermosetting adhesive coating.

10. A circuit board as recited in claim 9 in which said conductors are at least partially embedded in said thermosetting coating.

11. A circuit board as recited in claim 10 in which at least some of said terminal points comprise holes extending into said base.

12. A circuit board as recited in claim 11 in which the walls of said holes are coated with a conductive, electrolessly deposited metal.

13. A circuit board as recited in claim 12 in which at least one end of a preformed conductor terminates at the wall of one of said holes, said electrolessly deposited metal being coated on the walls of said hole and the end of said conductor to thereby bond said conductor end to said hole walls.

* * * * *